(12) United States Patent
Wang et al.

(10) Patent No.: US 11,552,265 B2
(45) Date of Patent: Jan. 10, 2023

(54) RESISTANCE-SWITCHING POLYMER FILMS AND METHODS OF MANUFACTURE

(71) Applicants: Applied Materials, Inc., Santa Clara, CA (US); National University of Singapore, Singapore (SG)

(72) Inventors: Xinke Wang, Singapore (SG); John Sudijono, Singapore (SG); Xiao Gong, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 174 days.

(21) Appl. No.: 17/078,509

(22) Filed: Oct. 23, 2020

(65) Prior Publication Data

US 2022/0131096 A1  Apr. 28, 2022

(51) Int. Cl.
*H01L 51/05* (2006.01)
*H01L 51/10* (2006.01)
*H01L 51/00* (2006.01)
*H01L 27/28* (2006.01)

(52) U.S. Cl.
CPC ........ *H01L 51/0591* (2013.01); *H01L 27/285* (2013.01); *H01L 51/0008* (2013.01); *H01L 51/102* (2013.01)

(58) Field of Classification Search
CPC ............... H01L 51/0591; H01L 27/285; H01L 51/0008; H01L 51/102
See application file for complete search history.

(56) References Cited

U.S. PATENT DOCUMENTS

| | | |
|---|---|---|
| 6,828,685 B2 | 12/2004 | Stasiak |
| 6,950,331 B2 | 9/2005 | Yang et al. |
| 7,656,696 B2 | 2/2010 | Joo et al. |
| 9,177,997 B2 | 11/2015 | Nelles et al. |
| 2005/0157535 A1 | 7/2005 | Jackson et al. |
| 2007/0029546 A1 | 2/2007 | Cho et al. |
| 2008/0308781 A1 | 12/2008 | Liao et al. |
| 2009/0272962 A1* | 11/2009 | Kumar ................ H01L 45/1253 257/43 |
| 2012/0074374 A1* | 3/2012 | Jo ........................ H01L 45/085 257/E45.001 |
| 2012/0313068 A1* | 12/2012 | Sakotsubo .......... H01L 27/2463 257/E45.002 |
| 2015/0093876 A1 | 4/2015 | Butcher et al. |
| 2015/0206585 A1* | 7/2015 | Kim .................... H01L 27/2463 257/4 |

FOREIGN PATENT DOCUMENTS

| | | | |
|---|---|---|---|
| CN | 102412368 A | * | 4/2012 |
| CN | 102810634 A | * | 12/2012 |
| WO | 2015167357 A1 | | 11/2015 |

OTHER PUBLICATIONS

U.S. Appl. No. 16/935,385, filed Jul. 22, 2020. "Molecular Layer Deposition Method and System".
Lin, Wen-Peng, et al., "Polymer-Based Resistive Memory Materials and Devices", Adv. Mater. 2014, 26, 570-606.
PCT International Search Report and Written Opinion in PCT/US2021/055733 dated Feb. 10, 2022, 11 pages.

* cited by examiner

*Primary Examiner* — David Vu
*Assistant Examiner* — Brandon C Fox
(74) *Attorney, Agent, or Firm* — Servilla Whitney LLC

(57) ABSTRACT

Devices comprising a resistance-switching polymer film are described. Also described are methods of making the devices comprising the resistance-switching polymer film.

20 Claims, 2 Drawing Sheets

RESISTANCE-SWITCHING POLYMER FILMS AND METHODS OF MANUFACTURE

FIELD

Embodiments of the disclosure relate electronic devices, and in particular to electronic devices including a resistance-switching polymer film and methods of manufacture.

BACKGROUND

The semiconductor industry faces many challenges in the pursuit of next generation data-storage technologies. Conventional Si-based data-storage technologies have been explored widely. The focus is on data-storage devices having faster speed, higher density and lower power.

One way to increase the device performance is by having nanoscale features. The features may be characterized by higher aspect ratios, for example greater than 5:1. Such features require complex fabrication steps such as multiple lithography steps and integration of high performance materials. However, this approach is facing theoretical and practical limitations. For example, as the deposition may occur at the top and along sidewalls of the feature, continued deposition may pinch off the feature including between sidewalls within the feature, and may produce voids within the feature. This can impact device performance and subsequent processing operations. There is a need in the manufacture of electronic devices such as memory devices, for example, resistive random access memory (RRAM) or other bistable/multi-stable electrical devices, to provide materials and methods that allow for more precise control of one or more of polymer film thickness composition, morphology and conformality.

SUMMARY

One aspect of the present disclosure is directed to a device comprising a first conductive material, a second conductive material and a resistance-switching polymer film separating the first conductive material and the second conductive material. The resistance-switching polymer film of some embodiments comprises one or more of a polyamide, a polyazomethine, a polyurea, a polyurethane and derivatives thereof.

Another aspect of the disclosure pertains to a method of depositing a resistance-switching polymer film by a molecular layer deposition (MLD) process. The method of some embodiments comprises flowing a first deposition precursor into a substrate processing region to form a compound layer on a substrate, removing the first deposition precursor from the substrate processing region, reacting the compound layer with a second deposition precursor in the substrate processing region to form the resistance-switching film on the substrate and removing the second deposition precursor from the substrate processing region.

Another aspect of the disclosure pertains to a method of forming a device. The method of some embodiments comprises patterning a first conductive material over a substrate, cross-patterning a resistance-switching polymer film over the first conductive material and depositing a second conductive material over the resistance-switching polymer film. The resistance-switching polymer film of some embodiments comprises one or more of a polyamide, a polyazomethine, a polyurea, a polyurethane and derivatives thereof.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
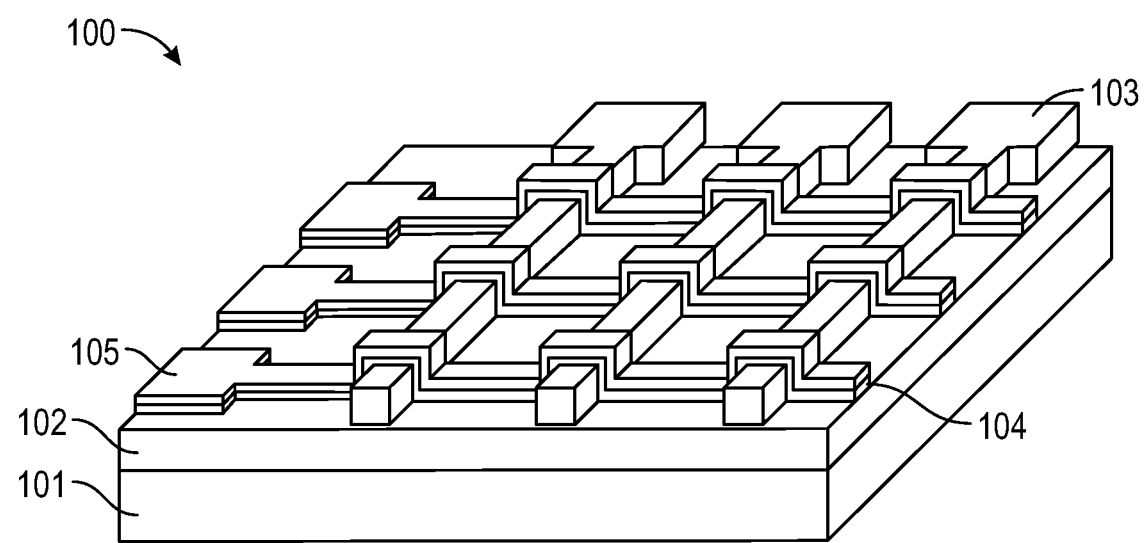
FIG. 1 shows a schematic of device comprising a resistance-switching polymer film according to an embodiment of the disclosure.

Before describing several exemplary embodiments of the invention, it is to be understood that the invention is not limited to the details of construction or process steps set forth in the following description. The invention is capable of other embodiments and of being practiced or being carried out in various ways.

A "substrate" or "substrate surface", as used herein, refers to any portion of a substrate or portion of a material surface formed on a substrate upon which film processing is performed. For example, a substrate surface on which processing can be performed includes materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate.

"Atomic layer deposition," "molecular layer deposition" or "cyclical deposition" as used herein refers to a process comprising the sequential exposure of two or more reactive compounds to deposit a layer of material on a substrate.

As used herein, the term "flexible" is used interchangeably to mean a substance with a species capable of bending or twisting without breaking.

As used in this specification and the appended claims, the terms "reactive compound", "reactive gas", "reactive species", "precursor", "process gas", "deposition precursor" and the like are used interchangeably to mean a substance with a species capable of reacting with the substrate or material on the substrate in a surface reaction (e.g., chemisorption, oxidation, reduction, cycloaddition). The substrate, or portion of the substrate, is exposed sequentially to the two or more reactive compounds which are introduced into a reaction zone of a processing chamber.

A "metal" as used herein refers to metal, metal alloy, metal oxide, metal nitride, or combination thereof comprising copper, cobalt, nickel, tungsten, ruthenium, chromium, iron, platinum, gold, silver, molybdenum, gallium and indium.

A "metal surface", as used herein, refers to any portion of a substrate or portion of a material surface formed with the metal. The metal surface may be exposed to a pretreatment process to polish, coat, dope, etch, reduce, oxidize, hydroxylate, anneal, UV cure, e-beam cure and/or bake the substrate. In addition to the pretreatment directly on the metal surface itself, in the present disclosure, any of the metal surface treatment disclosed may also be performed on an underlayer metal surface as disclosed in more detail below, and the term "metal surface" is intended to include such underlayer as the context indicates. Thus for example, where a film/layer or partial film/layer has been deposited onto the metal surface, the exposed surface of the newly deposited film/layer becomes the metal surface.

A "dielectric surface" or "dielectric film", as used herein, refers to any portion of a substrate or portion of a material surface formed with the dielectric material. Non-limiting examples of dielectric material include $SiO_x$, $Si_xN_y$, Si, SiON, $AlO_x$, $HfO_x$, $ZrO_2$, $TiO_x$, TiN, $Ta_xO_5$, $Y_2O_3$, $La_2O_3$, AlN, MgO, $CaF_2$, LiF, SrO, SiC, BaO, $HfSiO_4$, $LaAlO_3$, $Nb_2O_5$, $BaTiO_3$, $SrTiO_3$, $Bi_4Ti_3O_{12}$, $Pb(Zr,Ti)O_3$, $CaCu_3Ti_4O_{12}$, $LiNbO_3$, $BaTiO_3$, $LiNbO_3$ and $KNbO_3$. The dielectric surface may be exposed to a pretreatment process to polish, coat, dope, etch, reduce, oxidize, hydroxylate, anneal, UV cure, e-beam cure and/or bake the substrate. In addition to the pretreatment directly on the dielectric surface itself, in the present disclosure, any of the dielectric surface treatment disclosed may also be performed on an underlayer metal surface as disclosed in more detail below, and the term "dielectric surface" is intended to include such underlayer as the context indicates. Thus for example, where a film/layer or partial film/layer has been deposited onto the metal surface, the exposed surface of the newly deposited film/layer becomes the metal surface.

Embodiments of the disclosure provides a device comprising a first conductive material, a second conductive material and a resistance-switching polymer film separating the first conductive material and the second conductive material. In one or more embodiments, electronic devices such as memory devices, for example, resistive random access memory (RRAM) or other bistable/multi-stable electrical devices and methods for their manufacture are provided. In some embodiments, the methods provide more precise control of one or more of polymer film thickness composition, morphology and conformality. In some embodiments, the methods provide for device scaling, and the deposition process can be conducted at a low temperature, for example, from room temperature (e.g. 25° C. to 150° C.). In one or more embodiments, the resistance-switching polymer film has a thickness in a range of from 1 nm to 100 nm.

The resistance-switching polymer film of some embodiments comprises a high resistance state and a low resistance state, when imposing different electrical voltages across the resistance-switching polymer film. A ratio between the high resistance state and the low resistance state is in some embodiments in a range of from $10^1$ to $10^8$. Also, according to one or more embodiments, each resistance state, the low resistance state and the low resistance state, is retained for a time duration in a range of from $10^2$ seconds to $10^{10}$ seconds at a temperature in a range of from −200° C. to 200° C.

In some embodiments, one or more of the first conductive material and the second conductive material of the device has a thickness in a range of from 1 nm to 100 nm. One or more of the first conductive material and the second conductive material comprises one or more of TiN, TaN, Ti, Ni, Ag, Al, Au, Cu, Pt, $ZrN_x$, Ru, Pd, p- or n-doped Si, p-doped Ge or n-doped Ge, indium tin oxide (ITO), $SrRuO_3$, carbon nanotube, graphene and conductive polymer. The conductive polymer comprises one or more of polyacetylene, polypyrrole, polyindole, polyaniline, poly(3-alkylthiophenes) and derivatives thereof.

The device of some embodiments further comprises one or more dielectric film. The dielectric film of some embodiments is located between the resistance-switching polymer film and the first conductive material or the resistance-switching polymer film and the second conductive material. The dielectric film of some embodiments comprises $SiO_x$, $Si_xN_y$, Si, SiON, Ge, ITO, $AlO_x$, $HfO_x$, $ZrO_2$, $TiO_x$, TiN, $Ta_xO_5$, $Y_2O_3$, $La_2O_3$, AlN, MgO, $CaF_2$, LiF, SrO, SiC, BaO, $HfSiO_4$, $LaAlO_3$, $Nb_2O_5$, $BaTiO_3$, $SrTiO_3$, $Bi_4Ti_3O_{12}$, $Pb(Zr,Ti)O_3$, $CaCu_3Ti_4O_{12}$, $LiNbO_3$, $BaTiO_3$, $LiNbO_3$, $KNbO_3$ or combinations thereof.

In some embodiments, the device further comprises a substrate, and in specific embodiments, the device is affixed over the substrate. The substrate of some embodiments comprises $SiO_x$, $Si_xN_y$, Si, SiON, Ge, ITO, $AlO_x$, $HfO_x$, $ZrO_2$, $TiO_x$, TiN, $Ta_xO_5$, $Y_2O_3$, $La_2O_3$, MgO, AlN, $CaF_2$, LiF, SrO, SiC, BaO, $HfSiO_4$, $LaAlO_3$, $Nb_2O_5$, $BaTiO_3$, $SrTiO_3$, $Bi_4Ti_3O_{12}$, $Pb(Zr,Ti)O_3$, $CaCu_3Ti_4O_{12}$, $LiNbO_3$, $BaTiO_3$, $LiNbO_3$, $KNbO_3$, polyethylene naphthalate or combinations thereof.

The device of one or more embodiments is a bistable or multi-stable electrical device. The device of some embodiments is a resistive random access memory (RRAM) device. The device of some embodiments has one or more of the first conductive material, the second conductive material and the resistance-switching polymer film flexible and/or transparent.

According to one or more embodiments, a full dry process is provided that can be conducted at a low process temperature, compatible with the current semiconductor fabrication processes. The process can be utilized to deposit films on high aspect ratio structures. The high aspect ratio is in the range of from: 5:1 to 20:1, 6:1 to 20:1, 7:1 to 20:1, 8:1 to 20:1, 9:1 to 20:1, 10:1 to 20:1, 5:1 to 15:1, 6:1 to 15:1, 7:1 to 15:1, 8:1 to 15:1, 9:1 to 15:1, 10:1 to 15:1, 5:1 to 10:1, 6:1 to 10:1, 7:1 to 10:1, 8:1 to 10:1 or 9:1 to 10:1. One or more embodiments, provide for the manufacture of devices with a large memory window (e.g., On/Off>$10^5$). In some embodiments, different switching behaviors with different metal electrodes are provided, and multi-level resistance states are provided. In some embodiments, devices having good switching endurance and retention are provided.

In one or more embodiments, the resistance-switching polymer film comprises a polyamide or derivative, a polyazomethine or derivative, a polyurea or derivative, a polyurethane or derivative, a polyvinylidene chloride or derivative, a polystyrene or derivative, a polyethylene or derivative, a polyimide or derivative, a polymethylmethacrylate (PMMA) or derivative, a polyethylmethacrylate (PEMA) or derivative, a polybutylmethacrylate (PBMA) or derivative, a carbonized polyfurfurylalcohol or derivative, a polyacetylene or derivative, a polybenzene or derivative, a polyaniline or derivative, a polytetrabutyltin or derivative, a polyvinylfluoride or derivative or derivative, a polycarbonate-graphite composite or derivative, a polyacrylonitrile (PAN) derivative or derivative and their combinations. In some embodiments, the resistance-switching polymer film comprises a polyamide or derivative, a polyazomethine or derivative, a polyurea or derivative, a polyurethane or derivative and combinations thereof.

In one or more embodiments of the method, the first conductive material and the second conductive material comprises a first electrode and a second electrode respectively. In some embodiments of the method, each electrode, the first electrode and the second electrode, comprises a metal, a carbon nanotube, graphene, a conductive polymer or combination thereof. The metal includes metal, metal alloy, metal oxide, metal nitride, or combination thereof. Non-limiting examples of the electrode include TiN, TaN, Ti, Ni, Ag, Al, Au, Cu, Pt, $ZrN_x$, Ru, Pd, p- or n-doped Si, p-doped Si or n-doped Ge, indium tin oxide (ITO), $SrRuO_3$, a carbon nanotube, graphene, a conductive polymer or combinations thereof. Non-limiting example of the conductive polymer includes one or more of polyacetylene, polypyrrole, polyindole, polyaniline, poly(3-alkylthiophenes) and derivatives thereof.

In some embodiments, the devices is a bistable or multistable electrical device. In some embodiments, the device is a resistive random access memory (RRAM) device. In one or more embodiments, one or more of the first conductive material, the second conductive material, the resistance-switching polymer, the dielectric film and the substrate are flexible and/or transparent. In one or more embodiments, one or more of the first conductive material, the second conductive material, the resistance-switching polymer, the dielectric film and the substrate are flexible. In one or more embodiments, one or more of the first conductive material, the second conductive material, the resistance-switching polymer, the dielectric film and the substrate are transparent.

Figure 2:
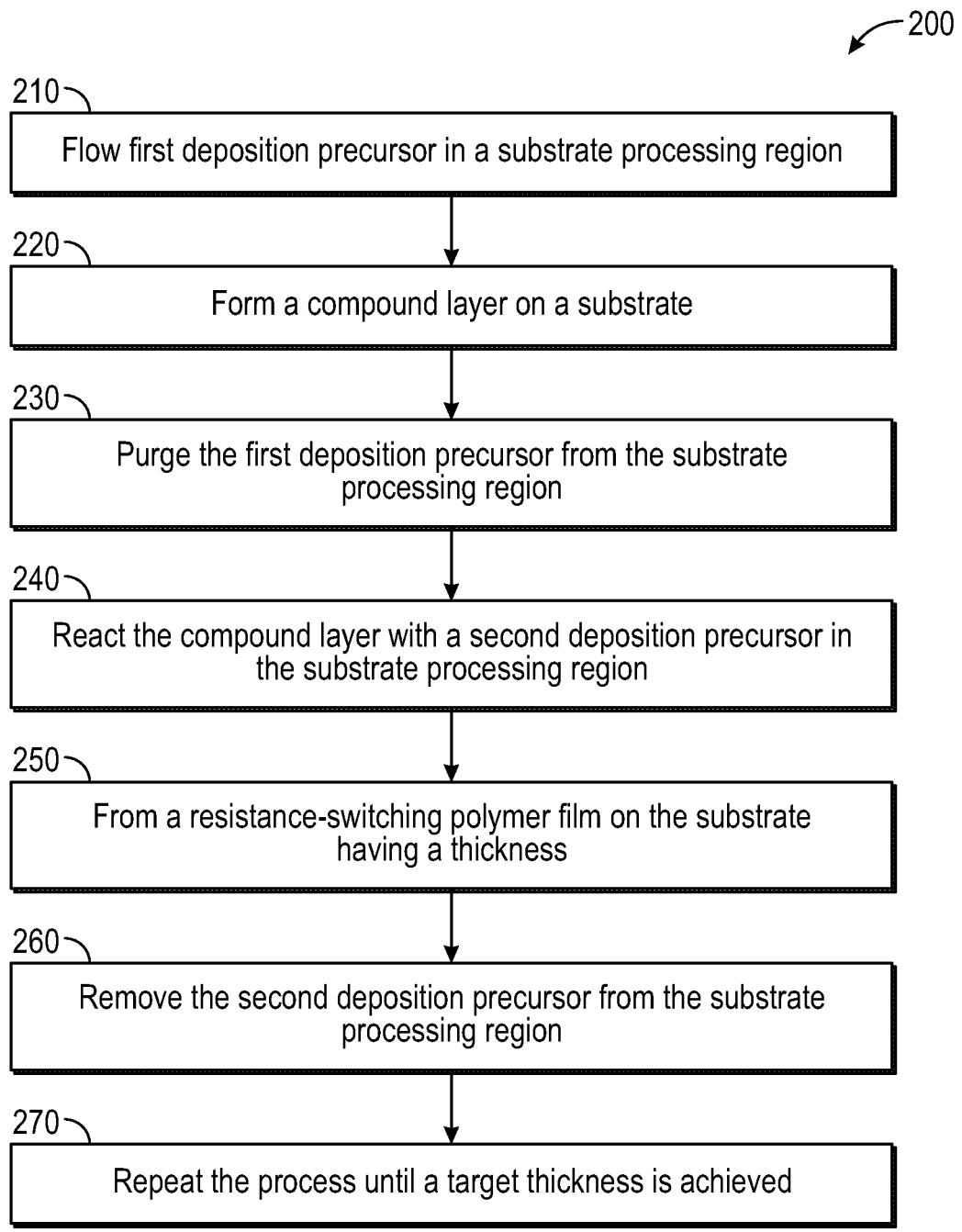
FIG. 2 is a flowchart showing a method according to an embodiment of the disclosure.

Referring to FIG. 2, embodiments of the disclosure provide a method 200 of depositing a resistance-switching polymer film by a deposition process. The deposition process of one or more embodiments comprises a molecular layer deposition (MLD) process, a chemical vapor deposition process or a plasma enhanced chemical vapor deposition process. In specific embodiments, the deposition process is a molecular layer deposition (MLD) process. In some embodiments of the method, the deposition process comprises at 210 flowing a first deposition precursor into a substrate processing region to form a compound layer at 220. The method 200 further comprises at 230 removing the first deposition precursor from the substrate processing region, and at 240 reacting the compound layer with a second deposition precursor into the substrate processing region to form the resistance-switching film at 250. The method further comprises at 260 removing the second precursor from the substrate processing region.

The first deposition precursor can be represented by a first formula:

X1-R1-X2 where, R1 comprises one or more of an alkyl group, an aromatic group and a cycloalkyl group, X1 comprises one or more of a hydroxide group, an aldehyde group, a ketone group, an acid group, an amino group, an isocyanate group, a thiocyanate group and an acyl chloride group, and X2 comprises one or more of a hydroxide group, an aldehyde group, a ketone group, an acid group, an amino group, an isocyanate group, a thiocyanate group and an acyl chloride group.

The first deposition precursor of some embodiments is selected from the group consisting of terephthaloyl chloride, terephthaldehyde and 1,4-phenylene diisocyanate.

The second deposition precursor can be represented by a second formula:

Y1-R2-Y2 where, R2 comprises one or more of an alkyl group, an aromatic group and a cycloalkyl group, Y1 comprises one or more of a hydroxide group, an aldehyde group, a ketone group, an acid group, an amino group, an isocyanate group, a thiocyanate group and an acyl chloride group, and Y2 comprises one or more of a hydroxide group, an aldehyde group, a ketone group, an acid group, an amino group, an isocyanate group, a thiocyanate group and an acyl chloride group.

The second deposition precursor of some embodiments is selected from the group consisting of ethylenediamine, tris(2-aminoethyl)amine, phenylenediamine, and 1,4-diaminocyclohexane.

The molecular layer deposition (MLD) process of some embodiments is repeated until the resistance-switching film has a thickness in the range of from 1 nm to 100 nm. The method of some embodiments is performed at a temperature in a range of from 1° C. to 200° C.

In some embodiments of the method, at 260 the deposition process is repeated at least once. In some embodiments of the method, the deposition process is repeated until the resistance-switching polymer film of the device has a thickness in the range of from: 0.1 nm to 200 nm, 0.1 nm to 180 nm, 0.1 nm to 160 nm, 0.1 nm to 140 nm, 0.1 nm to 120 nm, 0.1 nm to 100 nm, 0.1 nm to 80 nm, 0.1 nm to 60 nm, 0.1 nm to 40 nm, 0.1 nm to 20 nm, 0.1 nm to 10 nm, 1 nm to 200 nm, 1 nm to 180 nm, 1 nm to 160 nm, 1 nm to 140 nm, 1 nm to 120 nm, 1 nm to 100 nm, 1 nm to 80 nm, 1 nm to 60 nm, 1 nm to 40 nm, 1 nm to 20 nm, 1 nm to 10 nm, 5 nm to 200 nm, 5 nm to 180 nm, 5 nm to 160 nm, 5 nm to 140 nm, 5 nm to 120 nm, 5 nm to 100 nm, 5 nm to 80 nm, 5 nm to 60 nm, 5 nm to 40 nm, 5 nm to 20 nm, 5 nm to 10 nm, 10 nm to 200 nm, 10 nm to 180 nm, 10 nm to 160 nm, 10 nm to 140 nm, 10 nm to 120 nm, 10 nm to 100 nm, 10 nm to 80 nm, 10 nm to 60 nm, 10 nm to 40 nm or 10 nm to 20 nm.

In some embodiments of the method, the deposition process is performed at a temperature in the range of from: 1° C. to 500° C., 1° C. to 400° C., 1° C. to 300° C., 1° C. to 200° C. or 1° C. to 100° C.

In some embodiments of the method, the resistance-switching polymer film is deposited by the molecular layer deposition (MLD). In some embodiments of the method, the molecular layer deposition (MLD) comprises flowing the first deposition precursor into the substrate processing region to form the compound layer, removing the first deposition precursor from the substrate processing region, reacting the compound layer with the second deposition precursor into the substrate processing region to form the resistance-switching film and removing the second deposition precursor from the substrate processing region. Removing the first deposition precursor or the removing of the second deposition precursor is accomplished by vacuum, purge or both.

In some embodiments of the method, the molecular layer deposition (MLD) is repeated at least once. In some embodiments of the method, the molecular layer deposition (MLD) process is repeated until the resistance-switching polymer film of the device has a thickness in the ranges provided herein.

In some embodiments of the method, the molecular layer deposition (MLD) is performed at a temperature in the range of from: 1° C. to 500° C., 1° C. to 400° C., 1° C. to 300° C., 1° C. to 200° C. or 1° C. to 100° C.

In some embodiments of the method, the first deposition precursor is represented by a first formula

X1-R1-X2 where,

R1 comprises one or more of an alkyl group, an aromatic group and a cycloalkyl group, X1 comprises one or more of a hydroxide group, an aldehyde group, a ketone group, an acid group, an amino group, an isocyanate group, a thiocyanate group and an acyl chloride group, and X2 comprises one or more of a hydroxide group, an aldehyde group, a ketone group, an acid group, an amino group, an isocyanate group, a thiocyanate group and an acyl chloride group.

In some embodiments of the method, the first deposition precursor is selected from the group consisting of terephthaloyl chloride, terephthaldehyde and 1,4-phenylene diisocyanate.

In some embodiments of the method, the second deposition precursor is represented by a first formula

Y1-R1-Y2 where,

R1 comprises one or more of an alkyl group, an aromatic group and a cycloalkyl group, Y1 comprises one or more of a hydroxide group, an aldehyde group, a ketone group, an acid group, an amino group, an isocyanate group, a thiocyanate group and an acyl chloride group, and Y2 comprises one or more of a hydroxide group, an aldehyde group, a ketone group, an acid group, an amino group, an isocyanate group, a thiocyanate group and an acyl chloride group.

In some embodiments of the method, the second deposition precursor is selected from the group consisting of ethylenediamine, tris(2-aminoethyl)amine, phenylenediamine and 1,4-diaminocyclohexane.

In some embodiments, the substrate processing region is in a modular system comprising multiple chambers which perform various functions including substrate center-finding and orientation, degassing, annealing, deposition and/or etching. According to one or more embodiments, the modular system includes at least a first processing chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known modular systems which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, molecular layer deposition (MLD), cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in the processing chamber of modular system, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, the inert gas is used to purge or remove some or all of the reactants (e.g., reactant). According to one or more embodiments, the inert gas is injected at the exit of the processing chamber to prevent reactants (e.g., reactant, deposition precursors) from moving from the processing chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In a spatial deposition process, the reactive gases including deposition precursors are flowed into different processing regions within a processing chamber. The different processing regions are separated from adjacent processing regions so that the reactive gases do not mix. The substrate can be moved between the processing regions to separately expose the substrate to the reactive gases. During substrate movement, different portions of the substrate, or material on the substrate, are exposed to the two or more reactive gases so that any given point on the substrate is substantially not exposed to more than one reactive gas simultaneously. As will be understood by those skilled in the art, there is a possibility that a small portion of the substrate may be exposed to multiple reactive gases simultaneously due to diffusion of the gases within the processing chamber, and that the simultaneous exposure is unintended, unless otherwise specified.

In another aspect of the spatial deposition process, the reactive gases are delivered simultaneously to the reaction zone but are separated by an inert gas curtain and/or a vacuum curtain. The gas curtain can be combination of inert gas flows into the processing chamber and vacuum stream flows out of the processing chamber. The substrate is moved relative to the gas delivery apparatus so that any given point on the substrate is exposed to only one reactive gas.

A "pulse" or "dose" as used herein refers to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds.

In some embodiments of a time-domain deposition process, exposure to each reactive gas is separated by a time delay to allow each compound to adhere and/or react on the substrate surface and then be purged from the processing chamber. The reactive gases are prevented from mixing by the purging of the processing chamber between subsequent exposures.

In another aspect of a time-domain deposition process of some embodiments, a time delay exists between pulses of reactive gases. During each time delay, a purge gas, such as argon, is introduced into the processing chamber to purge the reaction zone or otherwise remove any residual reactive gas or reaction products or by-products from the reaction zone. The residual reactive gas or reaction products or by-products may be removed by pumping them out of the substrate deposition region without gas flow or combination with purge process. The pumping may be performed by applying vacuum. In some embodiments, residual reactive gas or reaction products or by-products may be removed by purging, purging-pumping, pumping-purging, pumping or their combination one or more times. Alternatively, the purge gas may flow continuously throughout the deposition process so that only the purge gas flows during the time delay between pulses of reactive gases. The reactive gases are alternatively pulsed with a pulse of purge gas there between multiple times.

The durations for each pulse/dose are variable and may be adjusted to accommodate, for example, the volume capacity of the processing chamber as well as the capabilities of a vacuum system coupled thereto. Additionally, the dose time of a reactive gas may vary according to the flow rate of the reactive gas, the temperature of the process gas, the type of control valve, the type of process chamber employed, as well as the ability of the components of the process gas to adsorb onto the substrate. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

Embodiments of the disclosure provide a method for making a device with a resistance-switching polymer film. The device comprises a first conductive material, a second conductive material and a resistance-switching polymer film separating the first conductive material and the second conductive material. Some embodiments of the device further comprise a substrate. In some embodiments of the devices, the device is affixed over the substrate. The method comprises patterning the first conductive material over the substrate, cross-patterning the resistance polymer film over the first conductive material and depositing the second conductive material over the resistance-switching polymer film.

In some embodiments of the methods and the devices described herein, the substrate comprises $SiO_x$, $Si_xN_y$, Si, SiON, Ge, ITO, $AlO_x$, $HfO_x$, $ZrO_2$, $TiO_x$, TiN, $Ta_2O_5$, $Y_2O_3$, $La_2O_3$, AlN, MgO, $CaF_2$, LiF, SrO, SiC, BaO, $HfSiO_4$, $LaAlO_3$, $Nb_2O_5$, $BaTiO_3$, $SrTiO_3$, $Bi_4Ti_3O_{12}$, $Pb(Zr,Ti)O_3$, $CaCu_3Ti_4O_{12}$, $LiNbO_3$, $BaTiO_3$, $LiNbO_3$, $KNbO_3$, polyethylene naphthalate or combinations thereof.

In some embodiments of the methods and the devices described herein, the substrate comprises dielectric film. Non-limiting examples of the dielectric film comprises $SiO_x$, $Si_xN_y$, Si, SiON, Ge, ITO, $AlO_x$, $HfO_x$, $ZrO_2$, $TiO_x$, TiN, $Ta_2O_5$, $Y_2O_3$, $La_2O_3$, AlN, MgO, $CaF_2$, LiF, SrO, SiC, BaO, $HfSiO_4$, $LaAlO_3$, $Nb_2O_5$, $BaTiO_3$, $SrTiO_3$, $Bi_4Ti_3O_{12}$, $Pb(Zr,Ti)O_3$, $CaCu_3Ti_4O_{12}$, $LiNbO_3$, $BaTiO_3$, $LiNbO_3$, $KNbO_3$ or combinations thereof.

In one or more embodiments of the methods and the devices described herein, the resistance-switching polymer film comprises a polyamide or derivative, a polyazomethine or derivative, a polyurea or derivative, a polyurethane or derivative, a polyvinylidene chloride or derivative, a polystyrene or derivative, a polyethylene or derivative, a polyimide or derivative, a polymethylmethacrylate (PMMA) or derivative, a polyethylmethacrylate (PEMA) or derivative, a polybutylmethacrylate (PBMA) or derivative, a carbonized polyfurfurylalcohol or derivative, a polyacetylene or derivative, a polybenzene or derivative, a polyaniline or derivative, a polytetrabutyltin or derivative, a polyvinylfluoride or derivative or derivative, a polycarbonate-graphite composite or derivative, a polyacrylonitrile (PAN) derivative or derivative and their combinations. In some embodiments of the methods and the devices, the resistance-switching polymer film comprises a polyamide or derivative, a polyazomethine or derivative, a polyurea or derivative, a polyurethane or derivative and their combinations.

In one or more embodiments of the methods and the devices described herein, the resistance-switching polymer film has at least two resistance states, when imposing different electrical voltages across the resistance-switching polymer film. In some embodiments of the methods and the devices, the resistance-switching polymer film has a high resistance state and a low resistance state, when imposing different electrical voltages across the resistance-switching polymer film. In some embodiments of the methods and the devices, the ratio between the high resistance state and the low resistance state is in the range of from: $10^1$ to $10^{10}$, $10^1$ to $10^9$, $10^1$ to $10^8$, $10^1$ to $10^7$, $10^1$ to $10^6$, $10^1$ to $10^5$, $10^1$ to $10^4$, $10^1$ to $10^3$, $10^1$ to $10^2$, $10^2$ to $10^{10}$, $10^2$ to $10^9$, $10^2$ to $10^8$, $10^2$ to $10^7$, $10^2$ to $10^6$, $10^2$ to $10^5$, $10^2$ to $10^4$, $10^2$ to $10^3$, $10^3$ to $10^{10}$, $10^3$ to $10^9$, $10^3$ to $10^8$, $10^3$ to $10^7$, $10^3$ to $10^6$, $10^3$ to $10^5$, $10^3$ to $10^4$, $10^4$ to $10^{10}$, $10^4$ to $10^9$, $10^4$ to $10^8$, $10^4$ to $10^7$, $10^4$ to $10^6$ or $10^4$ to $10^5$.

In one or more embodiments of the methods and the devices described herein, the resistance-switching polymer film retains the low resistance state for a time duration in the range of from: $10^1$ seconds to $10^{10}$ seconds, $10^1$ seconds to $10^9$ seconds, $10^1$ seconds to $10^8$ seconds, $10^1$ seconds to $10^7$ seconds, $10^1$ seconds to $10^6$ seconds, $10^1$ seconds to $10^5$ seconds, $10^1$ seconds to $10^4$ seconds, $10^1$ seconds to $10^3$ seconds, $10^1$ seconds to $10^2$ seconds, $10^2$ seconds to $10^{10}$ seconds, $10^2$ seconds to $10^9$ seconds, $10^2$ seconds to $10^8$ seconds, $10^2$ seconds to $10^7$ seconds, $10^2$ seconds to $10^6$ seconds, $10^2$ seconds to $10^5$ seconds, $10^2$ seconds to $10^4$ seconds, $10^2$ seconds to $10^3$ seconds, $10^3$ seconds to $10^{10}$ seconds, $10^3$ seconds to $10^9$ seconds, $10^3$ seconds to $10^8$ seconds, $10^3$ seconds to $10^7$ seconds, $10^3$ seconds to $10^6$ seconds, $10^3$ seconds to $10^5$ seconds, $10^3$ seconds to $10^4$ seconds, $10^4$ seconds to $10^{10}$ seconds, $10^4$ seconds to $10^9$ seconds, $10^4$ seconds to $10^8$ seconds, $10^4$ seconds to $10^7$ seconds, $10^4$ seconds to $10^6$ seconds or $10^4$ seconds to $10^5$ seconds at a temperature in the range of from: −250° C. to 250° C., −200° C. to 250° C., −150° C. to 250° C., −100° C.

to 250° C., −50° C. to 250° C., 0° C. to 250° C., 50° C. to 250° C., 100° C. to 250° C., 150° C. to 250° C., 200° C. to 250° C., −250° C. to 200° C., −200° C. to 200° C., −150° C. to 200° C., −100° C. to 200° C., −50° C. to 200° C., 0° C. to 200° C., 50° C. to 200° C., 100° C. to 200° C., 150° C. to 200° C., −250° C. to 150° C., −200° C. to 150° C., −150° C. to 150° C., −100° C. to 150° C., −50° C. to 150° C., 0° C. to 150° C., 50° C. to 150° C., 100° C. to 150° C., −250° C. to 100° C., −200° C. to 100° C., −150° C. to 100° C., −100° C. to 100° C., −50° C. to 100° C., 0° C. to 100° C., 50° C. to 100° C., −250° C. to 50° C., −200° C. to 50° C., −150° C. to 50° C., −100° C. to 50° C., −50° C. to 50° C. or 0° C. to 50° C. In some embodiments of the methods and the devices, the resistance-switching polymer film retains the low resistance state for a time duration in the range of from: $10^2$ seconds to $10^4$ seconds at a temperature range of from 20° C. or 50° C.

In one or more embodiments of the methods and devices described herein, the resistance-switching polymer film retains the high resistance state for a time duration in the range of from: $10^1$ seconds to $10^{10}$ seconds, $10^1$ seconds to $10^9$ seconds, $10^1$ seconds to $10^8$ seconds, $10^1$ seconds to $10^7$ seconds, $10^1$ seconds to $10^6$ seconds, $10^1$ seconds to $10^5$ seconds, $10^1$ seconds to $10^4$ seconds, $10^1$ seconds to $10^3$ seconds, $10^1$ seconds to $10^2$ seconds, $10^2$ seconds to $10^{10}$ seconds, $10^2$ seconds to $10^9$ seconds, $10^2$ seconds to $10^8$ seconds, $10^2$ seconds to $10^7$ seconds, $10^2$ seconds to $10^6$ seconds, $10^2$ seconds to $10^5$ seconds, $10^2$ seconds to $10^4$ seconds, $10^2$ seconds to $10^3$ seconds, $10^3$ seconds to $10^{10}$ seconds, $10^3$ seconds to $10^9$ seconds, $10^3$ seconds to $10^8$ seconds, $10^3$ seconds to $10^7$ seconds, $10^3$ seconds to $10^6$ seconds, $10^3$ seconds to $10^5$ seconds, $10^3$ seconds to $10^4$ seconds, $10^4$ seconds to $10^8$ seconds, $10^4$ seconds to $10^7$ seconds, $10^4$ seconds to $10^6$ seconds or $10^4$ seconds to $10^5$ seconds at a temperature in the range of from: −250° C. to 250° C., −200° C. to 250° C., −150° C. to 250° C., −100° C. to 250° C., −50° C. to 250° C., 0° C. to 250° C., 50° C. to 250° C., 100° C. to 250° C., 150° C. to 250° C., 200° C. to 250° C., −250° C. to 200° C., −200° C. to 200° C., −150° C. to 200° C., −100° C. to 200° C., −50° C. to 200° C., 0° C. to 200° C., 50° C. to 200° C., 100° C. to 200° C., 150° C. to 200° C., −250° C. to 150° C., −200° C. to 150° C., −150° C. to 150° C., −100° C. to 150° C., −50° C. to 150° C., 0° C. to 150° C., 50° C. to 150° C., 100° C. to 150° C., −250° C. to 100° C., −200° C. to 100° C., −150° C. to 100° C., −100° C. to 100° C., −50° C. to 100° C., 0° C. to 100° C., 50° C. to 100° C., −250° C. to 50° C., −200° C. to 50° C., −150° C. to 50° C., −100° C. to 50° C., −50° C. to 50° C. or 0° C. to 50° C. In some embodiments of the methods and the devices, the resistance-switching polymer film retains the high resistance state for a time duration in the range of $10^2$ seconds to $10^4$ seconds at 20° C. or 50° C.

In one or more embodiments of the methods and devices described herein, the first conductive material and the second conductive material comprise a first electrode and a second electrode respectively. In some embodiments of the methods and the devices, each electrode, the first electrode and the second electrode, comprises a metal, a carbon nanotube, graphene, a conductive polymer or combination thereof. The metal includes metal, metal alloy, metal oxide, metal nitride, or combination thereof. Non-limiting examples of the electrode include TiN, TaN, Ti, Ni, Ag, Al, Au, Cu, Pt, $ZrN_x$, Ru, Pd, p- or n-doped Si, p- or n-doped Ge, indium tin oxide (ITO), $SrRuO_3$, a carbon nanotube, graphene, conductive polymer or combinations thereof. Non-limiting examples of the conductive polymer include one or more of polyacetylene, polypyrrole, polyindole, polyaniline, poly(3-alkylthiophenes) and derivatives thereof.

In one or more embodiments of the methods and the devices described herein, the thickness of the first conductive material is in the range of from: 1 nm to 200 nm, 1 nm to 180 nm, 1 nm to 160 nm, 1 nm to 140 nm, 1 nm to 120 nm, 1 nm to 100 nm, 1 nm to 80 nm, 1 nm to 60 nm, 1 nm to 40 nm, 1 nm to 20 nm, 1 nm to 10 nm, 5 nm to 200 nm, 5 nm to 180 nm, 5 nm to 160 nm, 5 nm to 140 nm, 5 nm to 120 nm, 5 nm to 100 nm, 5 nm to 80 nm, 5 nm to 60 nm, 5 nm to 40 nm, 5 nm to 20 nm, 5 nm to 10 nm, 10 nm to 200 nm, 10 nm to 180 nm, 10 nm to 160 nm, 10 nm to 140 nm, 10 nm to 120 nm, 10 nm to 100 nm, 10 nm to 80 nm, 10 nm to 60 nm, 10 nm to 40 nm or 10 nm to 20 nm.

In one or more embodiments of the methods and the devices described herein, the thickness of the second conductive material is in the range of from: 1 nm to 200 nm, 1 nm to 180 nm, 1 nm to 160 nm, 1 nm to 140 nm, 1 nm to 120 nm, 1 nm to 100 nm, 1 nm to 80 nm, 1 nm to 60 nm, 1 nm to 40 nm, 1 nm to 20 nm, 1 nm to 10 nm, 5 nm to 200 nm, 5 nm to 180 nm, 5 nm to 160 nm, 5 nm to 140 nm, 5 nm to 120 nm, 5 nm to 100 nm, 5 nm to 80 nm, 5 nm to 60 nm, 5 nm to 40 nm, 5 nm to 20 nm, 5 nm to 10 nm, 10 nm to 200 nm, 10 nm to 180 nm, 10 nm to 160 nm, 10 nm to 140 nm, 10 nm to 120 nm, 10 nm to 100 nm, 10 nm to 80 nm, 10 nm to 60 nm, 10 nm to 40 nm or 10 nm to 20 nm.

One or more embodiments of the methods and the devices further comprise one or more dielectric films. In some embodiments of the methods and the devices, the one or more the dielectric films are located between the resistance-switching polymer film and the first conductive material, the resistance-switching polymer film and the second conductive material, or both. Non-limiting examples of the dielectric film comprises $SiO_x$, $Si_xN_y$, Si, SiON, Ge, ITO, $AlO_x$, $HfO_x$, $ZrO_2$, $TiO_x$, TiN, $Ta_xO_5$, $Y_2O_3$, $La_2O_3$, AlN, MgO, $CaF_2$, LiF, SrO, SiC, BaO, $HfSiO_4$, $LaAlO_3$, $Nb_2O_5$, $BaTiO_3$, $SrTiO_3$, $Bi_4Ti_3O_{12}$, $Pb(Zr,Ti)O_3$, $CaCu_3Ti_4O_{12}$, $LiNbO_3$, $BaTiO_3$, $LiNbO_3$, $KNbO_3$ or combinations thereof.

In one or more embodiments of the methods and the devices described herein, the thickness of dielectric film is in the range of from: 1 nm to 200 nm, 1 nm to 180 nm, 1 nm to 160 nm, 1 nm to 140 nm, 1 nm to 120 nm, 1 nm to 100 nm, 1 nm to 80 nm, 1 nm to 60 nm, 1 nm to 40 nm, 1 nm to 20 nm, 1 nm to 10 nm, 5 nm to 200 nm, 5 nm to 180 nm, 5 nm to 160 nm, 5 nm to 140 nm, 5 nm to 120 nm, 5 nm to 100 nm, 5 nm to 80 nm, 5 nm to 60 nm, 5 nm to 40 nm, 5 nm to 20 nm, 5 nm to 10 nm, 10 nm to 200 nm, 10 nm to 180 nm, 10 nm to 160 nm, 10 nm to 140 nm, 10 nm to 120 nm, 10 nm to 100 nm, 10 nm to 80 nm, 10 nm to 60 nm, 10 nm to 40 nm or 10 nm to 20 nm.

FIG. 1 shows a device 100 comprising a resistance-switching polymer film 104. The device 100 includes a substrate 101, a dielectric film 102 on the substrate, a first electrode 103 on the dielectric film, a resistance-switching polymer film 104 on the first electrode 103 and a second electrode 105 on the resistance-switching polymer film 104. In some embodiments, the substrate 101 comprises Si. In some embodiments, the dielectric film 102 comprises $SiO_2$. In some embodiments, the first electrode 103 comprises TiN. In some embodiments, the first electrode has a thickness of 50 nm. In some embodiments, the resistance-switching polymer film is deposited by a molecular layer deposition (MLD) process. In some embodiments, the second electrode comprises Pt or Ag. In some embodiments, the second electrode is deposited by an electron-beam evaporation process.

In some embodiments of the methods and the devices, one or more of the first conductive material, the second conductive material, the resistance-switching polymer, the dielectric film and the substrate are flexible and/or transparent. In some embodiments of the methods and the devices, one or more of the first conductive material, the second conductive material, the resistance-switching polymer, the dielectric film and the substrate are flexible. In some embodiments of the methods and the devices, one or more of the first conductive material, the second conductive material, the resistance-switching polymer, the dielectric film and the substrate are transparent.

In some embodiments of the method, one or more of the resistance-switching polymer film are formed by a process comprising a molecular layer deposition, glow-discharge polymerization, vacuum thermal evaporation, deposition from solution, electron-beam deposition, γ-ray irradiation polymerization, thermal polymerization, isothermal immersion technique or plasma polymerization.

In an aspect of the disclosure, the processes are generally be stored in the memory as a software routine that, when executed by a controller or a processor, causes a substrate processing chamber to perform processes of the present disclosure described herein. The software routine may also be stored and/or executed by a second controller or processor (not shown) that is remotely located from the hardware being controlled by the first controller or processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor or controller, transforms the general purpose computer into a specific purpose computer (controller) that controls the chamber operation such that the processes are performed. The instructions to execute operation of one or more processes described herein can be stored on non-transitory computer readable medium including instructions, that, when executed by a controller of a substrate processing chamber, causes the substrate processing chamber to for a resistance-switching film.

EXAMPLES

The following non-limiting examples demonstrate principles according to one or more embodiments of the disclosure.

RRAM Device with TiN/Resistance-Switching Polyamide Film/Pt

A RRAM device was prepared using resistance-switching polyamide film. The method comprised patterning a first electrode on a substrate, cross-patterning resistance-switching polyamide film and depositing a second electrode. The substrate was comprised of $Si/SiO_2$. The first electrode was TiN. The thickness of first electrode was 50 nm.

The polyamide film was deposited by a molecular layer deposition (MLD) process. The molecular layer deposition (MLD) process comprised flowing terphthaloyl chloride, a first deposition precursor, into a substrate processing region to form a compound layer, removing terphthaloyl chloride from the substrate processing region, reacting ethylenediamine, a second deposition precursor, with the compound layer into the substrate processing region to form the resistance-switching polyamide film, removing ethylenediamine from the substrate processing region, and repeating the process until the thickness of resistance-switching polyamide film is 10 nm. The second electrode was Pt. The thickness of second electrode was 60 nm.

The device having the TiN and Pt electrodes and the resistance-switching polyamide film sandwiched between the electrodes exhibited a remarkably large memory window of more than $10^5$ at low compliance current of 100 μA, significant stability over at least 100 switching cycles and robust data retention for more than 3 hours. Bipolar current versus voltage curves of a high resistance state and a low resistance state showed a ratio between the high resistance state and the law resistance state of $4.4 \times 10^5$. Multilevel current (MLC) characteristics of the polyamide film were recorded and graphed at compliance current of 1 μA, 10 μA, 20 μA, 40 μA and 100 μA. The tests demonstrated that 2 bit ($2^2$=4) multilevel states are obtained by varying CC from 1 to 100 μA. Cycle to cycle uniformity characteristics were tested, showing reproducibility of the resistance-switching polyamide film over 100 switching cycles. In addition, the film showed robust data retention characteristics of greater than 3 hours with a larger memory window ($>10^5$) for both HRS and LRS states.

RRAM Device with TiN/Resistance-Switching Polyamide Film/Ag

A RRAM device was prepared using resistance-switching polyamide film. The method comprised patterning a first electrode on a substrate surface, cross-patterning resistance-switching polyamide film and depositing a second electrode. The substrate surface was comprised of $Si/SiO_2$. The first electrode was TiN. The thickness of first electrode was 50 nm. The polyamide film was deposited by a molecular layer deposition (MLD) process. The molecular layer deposition (MLD) process comprised flowing terphthaloyl chloride, a first deposition precursor, into a substrate processing region to form a compound layer, removing terphthaloyl chloride from the substrate processing region, reacting ethylenediamine, a second deposition precursor, with the compound layer into the substrate processing region to form the resistance-switching polyamide film, removing ethylenediamine from the substrate processing region, and repeating the process until the thickness of resistance-switching polyamide film is 10 nm. The second electrode was Ag. The thickness of second electrode was 60 nm. Bipolar current versus voltage curves were generated and showed that the device having the resistance-switching polyamide film sandwiched between Ag electrode and TiN electrode exhibited remarkably large memory window of more than $5 \times 10^2$ at low compliance current of 10 μA. The polyamide film was observed to have a low resistance state and a high resistance state, wherein the ratio between the high resistance state and the law resistance state was observed to be $5 \times 10^2$. The device was operated at low current, wherein compliance current was 10 μA and voltage was less than 1 V.

RRAM Device with TiN/Resistance-Switching Polyazomethine Film/Ag

A RRAM device was prepared using a resistance-switching polyazomethine film. The method comprised patterning a first electrode on a substrate surface, cross-patterning resistance-switching polyazomethine film and depositing a second electrode. The substrate surface was comprised of $Si/SiO_2$. The first electrode was TiN. The thickness of first electrode was 50 nm. The polyamide film was deposited by a molecular layer deposition (MLD) process. The molecular layer deposition (MLD) process comprised flowing terephthaldehyde, a first deposition precursor, into a substrate processing region to form a compound layer, removing terephthaldehyde from the substrate processing region, reacting ethylenediamine, a second deposition precursor, with the compound layer into the substrate processing region to form the resistance-switching polyazomethine film, removing ethylenediamine from the substrate processing region, and repeating the process until the thickness of resistance-switching polyazomethine film was 3 nm. The second electrode was Ag. The thickness of second electrode was 60 nm.

Bipolar current versus voltage curves were generated and showed that the device had a remarkably large memory window of more than $10^4$ at compliance current of 1 mA. The polyamide film was observed to have a low resistance state and a high resistance state, wherein the ratio between the high resistance state and the law resistance state was observed to be $10^4$. The device was operated at compliance current of 1 mA. The device was observed to be stable for at least 60 switching cycles.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A device comprising:
   a first conductive material;
   a second conductive material; and
   a resistance-switching polymer film separating the first conductive material and the second conductive material, wherein the resistance-switching polymer film comprises one or more of a polyamide, a polyazomethine, a polyurea, a polyurethane and derivatives thereof, wherein the resistance-switching polymer film comprises a high resistance state and a low resistance state, when imposing different electrical voltages across the resistance-switching polymer film and a ratio between the high resistance state and the low resistance state is in a range of from $10^1$ to $10^8$.

2. The device of claim 1, wherein the resistance-switching polymer film is made by a molecular layer deposition process and has a thickness in a range of from 1 nm to 100 nm.

3. The device of claim 1, wherein each resistance state, the high resistance state and the low resistance state, is retained for a time duration in a range of from $10^2$ seconds to $10^{10}$ seconds at a temperature in a range of from −200° C. to 200° C.

4. The device of claim 1, wherein one or more of the first conductive material and the second conductive material has a thickness in a range of from 1 nm to 100 nm.

5. The device of claim 1, wherein one or more of the first conductive material and the second conductive material comprises one or more of TiN, TaN, Ti, Ni, Ag, Al, Au, Cu, Pt, $ZrN_x$, Ru, Pd, p-doped Si, n-doped Si, p- or n-doped Ge, indium tin oxide (ITO), $SrRuO_3$, a carbon nanotube, graphene, polyacetylene, polypyrrole, polyindole, polyaniline, poly(3-alkylthiophenes) and derivatives thereof.

6. The device of claim 1, wherein the device further comprise one or more dielectric films, and wherein the one or more dielectric films is located between the resistance-switching polymer film and at least one of the first conductive material and the second conductive material.

7. The device of claim 6, wherein the one or more dielectric films comprises $SiO_x$, $Si_xN_y$, Si, SiON, Ge, ITO, $AlO_x$, $HfO_x$, $ZrO_2$, $TiO_x$, TiN, $Ta_xO_5$, $Y_2O_3$, $La_2O_3$, AlN, MgO, $CaF_2$, LiF, SrO, SiC, BaO, $HfSiO_4$, $LaAlO_3$, $Nb_2O_5$, $BaTiO_3$, $SrTiO_3$, $Bi_4Ti_3O_{12}$, $Pb(Zr,Ti)O_3$, $CaCu_3Ti_4O_{12}$, $LiNbO_3$, $BaTiO_3$, $LiNbO_3$, $KNbO_3$ or combinations thereof.

8. The device of claim 1, further comprising a substrate, wherein the device of claim 1 is affixed over the substrate and wherein the substrate comprises $SiO_x$, $Si_xN_y$, Si, SiON, Ge, ITO, $AlO_x$, $HfO_x$, $ZrO_2$, $TiO_x$, TiN, $Ta_xO_5$, $Y_2O_3$, $La_2O_3$, AlN, MgO, $CaF_2$, LiF, SrO, SiC, BaO, $HfSiO_4$, $LaAlO_3$, $Nb_2O_5$, $BaTiO_3$, $SrTiO_3$, $Bi_4Ti_3O_{12}$, $Pb(Zr,Ti)O_3$, $CaCu_3Ti_4O_{12}$, $LiNbO_3$, $BaTiO_3$, $LiNbO_3$, $KNbO_3$, polyethylene naphthalate or combinations thereof.

9. The device of claim 1, wherein the device is a bistable or multi-stable electrical device.

10. The device of claim 1, wherein the device is a resistive random access memory (RRAM) device.

11. A method of depositing a resistance-switching polymer film by a molecular layer deposition (MLD) process, wherein the method comprises:
    flowing a first deposition precursor into a substrate processing region to form a compound layer on a substrate, wherein the first deposition precursor is represented by a first formula

X1-R1-X2 where,
    R1 comprises one or more of an alkyl group, an aromatic group and a cycloalkyl group,
    X1 comprises one or more of a hydroxide group, an aldehyde group, a ketone group, an acid group, an amino group, an isocyanate group, a thiocyanate group and an acyl chloride group, and
    X2 comprises one or more of a hydroxide group, an aldehyde group, a ketone group, an acid group, an amino group, an isocyanate group, a thiocyanate group and an acyl chloride group;
    removing the first deposition precursor from the substrate processing region;
    reacting the compound layer with a second deposition precursor in the substrate processing region to form the resistance-switching polymer film on the substrate, wherein the second deposition precursor is represented by a second formula

Y1-R2-Y2 where,
    R2 comprises one or more of an alkyl group, an aromatic group and a cycloalkyl group,
    Y1 comprises one or more of a hydroxide group, an aldehyde group, a ketone group, an acid group, an amino group, an isocyanate group, a thiocyanate group and an acyl chloride group, and Y2 comprises one or more of a hydroxide group, an aldehyde group, a ketone group, an acid group, an amino group, an isocyanate group, a thiocyanate group and an acyl chloride group; and removing the second deposition precursor from the substrate processing region.

12. The method of claim 11, wherein the first deposition precursor is selected from the group consisting of terephthaloyl chloride, terephthaldehyde and 1,4-phenylene diisocyanate.

13. The method of claim 11, wherein the second deposition precursor is selected from the group consisting of ethylenediamine, tris(2-aminoethyl)amine, phenylenediamine, and 1,4-diaminocyclohexane.

14. The method of claim 11, wherein the molecular layer deposition (MLD) process is repeated until the resistance-switching film has a thickness in a range of from 1 nm to 100 nm.

15. The method of claim 11, wherein the method is performed at a temperature in a range of from 1° C. to 200° C.

16. The method of claim 11, further comprising forming a device, the method further comprising:
patterning a first conductive material over a substrate;
cross-patterning the resistance-switching polymer film over the first conductive material, wherein the resistance-switching polymer film comprises one or more of a polyamide, a polyazomethine, a polyurea, a polyurethane and derivatives thereof; and
depositing a second conductive material over the resistance-switching polymer film.

17. The method of claim 16, wherein the method further comprises depositing one or more dielectric films and wherein the one or more dielectric films comprises $SiO_x$, $Si_xN_y$, Si, SiON, $AlO_x$, $HfO_x$, $ZrO_2$, $TiO_x$, $Ta_xO_5$, $Y_2O_3$, $La_2O_3$, AlN, MgO, $CaF_2$, LiF, SrO, SiC, BaO, $HfSiO_4$, $LaAlO_3$, $Nb_2O_5$, $BaTiO_3$, $SrTiO_3$, $Bi_4Ti_3O_{12}$, $Pb(Zr,Ti)O_3$, $CaCu_3Ti_4O_{12}$, $LiNbO_3$, $BaTiO_3$, $LiNbO_3$, $KNbO_3$ or combinations thereof.

18. The method of claim 16, wherein the resistance-switching polymer film comprises a high resistance state and a low resistance state, when imposing different electrical voltages across the resistance-switching polymer film and a ratio between the high resistance state and the low resistance state is in a range of from $10^1$ to $10^8$.

19. The method of claim 18, wherein each resistance state, the high resistance state and the low resistance state, is retained for a time duration in a range of from $10^2$ seconds to $10^{10}$ seconds at a temperature in a range of from −200° C. to 200° C.

20. The method of claim 16, wherein the device is a resistive random access memory (RRAM) device.

* * * * *

UNITED STATES PATENT AND TRADEMARK OFFICE
CERTIFICATE OF CORRECTION

PATENT NO. : 11,552,265 B2
APPLICATION NO. : 17/078509
DATED : January 10, 2023
INVENTOR(S) : Wang et al.

It is certified that error appears in the above-identified patent and that said Letters Patent is hereby corrected as shown below:

In the Specification

•Column 4, Line 20, replace "MgO, AlN" after "$La_2O_3$" and before "$CaF_2$" with "AlN, MgO".

Signed and Sealed this
Twenty-eighth Day of February, 2023

Katherine Kelly Vidal
*Director of the United States Patent and Trademark Office*